United States Patent [19]
Mountsier et al.

[11] Patent Number: 6,150,258
[45] Date of Patent: Nov. 21, 2000

[54] PLASMA DEPOSITED FLUORINATED AMORPHOUS CARBON FILMS

[75] Inventors: Thomas Weller Mountsier, San Jose, Calif.; Michael J. Shapiro, Austin, Tex.

[73] Assignee: International Business Machines Corporation, Armonk, N.Y.

[21] Appl. No.: 09/303,538

[22] Filed: May 3, 1999

Related U.S. Application Data

[62] Division of application No. 09/069,723, Apr. 29, 1998.

[51] Int. Cl.$^7$ .................................................. H01L 21/4763
[52] U.S. Cl. ............................ 438/623; 438/763; 438/780
[58] Field of Search ..................................... 438/623, 763, 438/780, 781, 622

[56] References Cited

U.S. PATENT DOCUMENTS

| | | | |
|---|---|---|---|
| 4,783,368 | 11/1988 | Yamamoto et al. | 428/408 |
| 4,938,995 | 7/1990 | Giordano et al. | 427/41 |
| 5,225,032 | 7/1993 | Golecki | 156/612 |
| 5,244,730 | 9/1993 | Nguyen et al. | 428/336 |
| 5,302,420 | 4/1994 | Nguyen et al. | 427/490 |
| 5,442,237 | 8/1995 | Hughes et al. | 257/759 |
| 5,549,935 | 8/1996 | Nguyen et al. | 427/490 |
| 5,698,901 | 12/1997 | Endo | 257/758 |
| 5,844,225 | 1/1998 | Kimock et al. | 235/462 |
| 5,888,591 | 3/1999 | Gleason et al. | 427/522 |
| 5,942,328 | 8/1999 | Grill et al. | 428/408 |
| 5,942,769 | 8/1999 | Grill et al. | 257/77 |
| 6,043,167 | 3/2000 | Lee et al. | 438/789 |

FOREIGN PATENT DOCUMENTS 0 701 283 A2  3/1996  European Pat. Off. .

OTHER PUBLICATIONS

Matsubara et al.; Low-k Fluorinated Amorphous Carbon Interlayer Technology for Quarter Micron Devices. 1996 International Electron Devices Meeting, Dec. 8–11, 1996. pp. 369–372.

Mountsier et al.; Adhesion of Fluorinated Amorphous Carbon to Various Materials [Metallisation]. Proceedings of the IEEE 1998 International Interconnect Technology Conference, Jun. 1–3, 1998. pp. 280–282.

S. Takeishi, et al., "Fluorocarbon Films Deposited by PECVD with High Thermal Resistance and Low Dielectric Constants", DUMIC Conference 1996 ISMIC—111D/96/0071, pp. 71–77 (Feb. 20–21, 1996).

H. Kudo, et al., "Characteristics of Plasma–CF Films for Very Low–K Dielectrics", DUMIC Conference 1997 ISMIC—222D/97/0085, pp. 85–92 (Feb. 10–11, 1997).

T.W. Mountsier et al., "Fluorocarbon Films from Plasma Polymerization of Hexafluoropropylene", Mat. Res. Symp. Proc., vol. 443, pp. 41–46 (1997).

K. Endo, et al., "Fluorinated Amorphous Carbon Thin Films Grown by Plasma Enhanced Chemical Vapor Deposition for Low Dielectric Constant Interlayer Dielectrics", J. Appl. Phys. 78(2), pp. 1370–1372 (Jul. 15, 1995).

K. Endo, et al., Deposition of Silicon Dioxide Films on Amorphous Carbon Films by Plasma Enhanced Chemical Vapor Deposition for Low Dielectric Constant Interlayer Dielectrics, Appl. Phys. Lett. 70(9), pp. 1078–1079 (Mar. 3, 1997).

(List continued on next page.)

*Primary Examiner*—Donald L. Monin, Jr.
*Assistant Examiner*—Ginette Peralta
*Attorney, Agent, or Firm*—Pollock, Vande Sande & Amernick

[57] ABSTRACT

An interlevel dielectric stack for use in semiconductor devices is provided. The interlevel stack includes a bottom adhesion layer, a middle layer composed of a fluorinated amorphous carbon film, and a top adhesion layer. The bottom and top adhesion layers are composed of a silicon carbide material containing hydrogen. The dielectric stack is subjected to rigorous adhesion and thermal testing. A single continuous process for depositing the dielectric stack in a high density plasma reactor is also provided.

7 Claims, 1 Drawing Sheet

OTHER PUBLICATIONS

Y. Matsubara, et al., "Low–K Fluorinated Amorphous Carbon Interlayer Technology for Quarter Micron Devices", 1996 IEEE, IEDM 96–369, pp. 14.6.1–14.6.4 (1996).

K. Endo, et al., Effect of Bias Addition on the Gap–Filling Properties of Fluorinated Amorphous Carbon Thin Films Grown by Helicon Wave Plasma–Enhanced Chemical Vapor Deposition, Jpn. J. Appl. Phys., vol. 35, Part 2, No. 10B, pp. 1348–1350 (Oct. 15, 1996).

K. Endo, et al., "Nitrogen Doped Fluorinated Amorphous Carbon Thin Films Grown by Plasma Enhanced Chemical Vapor Deposition for Low Dielectric Constant Interlayer Dielectrics", Appl. Phys. Lett. 68(25), pp. 3656–3658 (Jun. 17, 1996).

S. Takeishi, et al., "Plasma–Enhanced Chemical Vapor Deposition of Fluorocarbon Films with High Thermal Resistance and Low Dielectric Constants", J. Electrochem. Soc., vol. 144, No. 5, pp. 1797–1802 (May 1997).

PLASMA DEPOSITED FLUORINATED AMORPHOUS CARBON FILMS

This is a division of U.S. patent application Ser. No. 09/069,723, filed Apr. 29, 1998.

BACKGROUND OF THE INVENTION

1. Field of the Invention

The present invention relates generally to processes for making fluorinated amorphous carbon films and more specifically to processes for making fluorinated amorphous carbon films for use as interlevel dielectric layers.

2. Description of Related Art

Advanced integrated circuits for semiconductor devices having higher performance and greater functionality are often characterized by decreasing device feature geometries. As device geometries become smaller, the dielectric constant of an insulating material used between conducting paths becomes an increasingly important factor in device performance. Reducing this value advantageously lowers power consumption, reduces crosstalk, and shortens signal delay for closely spaced conductors.

Silicon oxide ($SiO_2$) has long been used in integrated circuits as the primary insulating material. With a dielectric constant of approximately 4, $SiO_2$ has the lowest dielectric constant of all inorganic materials. Adding small amounts of fluorine into the $SiO_2$ film can lower this value to 3–3.5. Further reduction, though, requires use of organic materials. Fluorocarbon-based polymers have been recognized as potentially attractive low dielectric constant materials. For example, polytetrafluoroethylene (PTFE) has a bulk dielectric constant of around 2, essentially the lowest of any non-porous, solid material. However, such fluorocarbon polymers generally have-limited thermal stability, with decomposition occurring around 250–300° C., making them incompatible with many semiconductor fabrication processes. They generally have limited mechanical stability, as well.

It is known that the dielectric constant of a fluorocarbon film decreases with increasing fluorine concentration. (See, for example, S. Takeishi, et al., *J. Electrochem. Soc.* Vol. 144, p.1797 (1997).) It is also known that fluorine concentration is one of the factors affecting the thermal stability of such films, the stability decreasing with increasing fluorine concentration. The challenge, then, is to provide a fluorocarbon film as an interlevel dielectric layer that simultaneously meets the criteria of low dielectric constant, thermal stability, and physical durability.

One attempt at a polymeric fluorocarbon layer is described in U.S. Pat. No. 5,244,730, "PLASMA DEPOSITION OF FLUOROCARBON." The fluorocarbon film, prepared by plasma enhanced chemical vapor deposition, is reported to have a maximum dielectric constant of about 2.5, a F:C ratio of about 1:1 to 3:1, and is reported to be thermally stable to about 350° C. However, the fluorocarbon layer does not adhere sufficiently to typical semiconductor substrates. To improve adhesion, a thin layer of silicon or a metal silicide is introduced between the substrate and the polymeric film, such that a region containing a high density of Si—C bonds is formed. (See U.S. Pat. No. 5,549,935, "ADHESION PROMOTION OF FLUOROCARBON FILMS".) This adhesion technique, however, does not address the adhesion of the polymeric film to subsequently deposited layers above the film.

Another attempt at providing a fluorocarbon dielectric layer is reported in U.S. Pat. No. 5,698,901, "SEMICONDUCTOR DEVICE WITH AMORPHOUS CARBON LAYER FOR REDUCING WIRING DELAY" by Endo. Fluorinated amorphous carbon films, produced by plasma-enhanced chemical vapor deposition using $CF_4$, $C_2F_6$, $C_3F_6$, $C_4F_8$, or $CHF_3$ as a fluorine precursor, have dielectric constants between 2.3 and 2.6, fluorine content between 48% and 56%, and are heated to temperatures between 300 and 470° C. before beginning to decompose. Problems of adhesion and delamination need to be addressed, however, to be able to integrate the fluorinated amorphous carbon films of Endo into semiconductor devices. The approach of Endo to these problems involves multiple layers. An adhesion layer is provided by varying the fluorine content in the film such that the lower edge of the film near the substrate is pure amorphous carbon. Further, a buffer layer is introduced between the film and the elements of the semiconductor device to suppress gas discharge out of the film on heating. Finally, a transition layer between the buffer layer and the film, with composition varying gradually between that of the buffer layer and that of the film, is used.

Thus there is a need for a simpler approach to promoting adhesion of a fluorocarbon film to materials commonly used in semiconductor devices. It would be desirable if an adhesion layer also serves as a capping layer to suppress gas discharge out of the film on heating. It would be desirable for the fluorocarbon/adhesion layer stack to withstand rigorous adhesion and thermal testing. In addition, it would be desirable to provide a single continuous process for producing the fluorocarbon interlevel layer in a semiconductor device. It would further be desirable to produce films with particular F:C ratios by use of advantageous fluorocarbon precursors.

SUMMARY OF THE INVENTION

The present invention is directed to an interlevel dielectric layer stack for use in semiconductor devices, including a bottom adhesion layer, a fluorinated amorphous carbon layer, and a top adhesion layer. Advantageously, the bottom and top adhesion layers are composed of a silicon carbide material containing hydrogen, hereinafter referred to as SiC. The fluorinated amorphous carbon layer (FlAC) has a fluorine content between 32% and 58%. Advantageously, the fluorine content is between 40% and 45%. The dielectric constant of the SiC/FlAC/SiC stack, referred to hereinafter as the FlAC stack, is between 2.5 and 3.3; advantageously the stack dielectric constant is 2.85 or less.

The present invention further includes a single continuous process for depositing the SiC/FlAC/SiC stack on a semiconductor wafer by plasma deposition in a high density plasma reactor. The reactor includes a reaction chamber with a chuck for supporting the wafer and for providing cooling to the wafer. A plasma is produced in the reaction chamber. For example, a plasma is produced in the reaction chamber by an external induction coil driven by a radio frequency (rf) power source. Radio frequency bias is optionally applied to the wafer. The three-layer film stack is deposited by introducing different process gases at different times, controlling the process conditions: ion source power, rf bias on the wafer, chamber pressure, and deposition temperature, for each deposition step.

First the SiC layer is deposited by introducing a flow of $SiH_4$ and a hydrocarbon source, for example, $C_2H_2$, into the chamber. Next, one or more fluorocarbon precursors are introduced to deposit the FlAC layer. Finally, a second flow of $SiH_4$ and the hydrocarbon gas is used to deposit the top SiC layer. The flow of the SiC precursors, and the FlAC precursor(s) overlap for a certain time period at the start of the deposition of the second and third layers. After deposition, the FlAC stack is optionally annealed before deposition of an overlayer. In certain embodiments, post-deposition annealing is not found to be necessary.

A beneficial fluorocarbon precursor that has not previously been used to deposit fluorinated amorphous carbon films is also provided under the present invention. Hexafluorobenzene ($C_6F_6$), which has a F:C ratio of 1:1, the lowest of any previously reported fluorocarbon precursor, is advantageously used to deposit the FlAC layer. $C_6F_6$ is used as a precursor by itself, in combination with one or more fluorocarbons, or in combination with hydrogen.

Using $C_6F_6$ as a fluorocarbon precursor, FlAC films are deposited at a higher temperature (approximately 400° C.) and the resulting films exhibit greater thermal stability than films deposited at lower temperatures (<100° C.) from commonly used precursors like $C_2F_6$, $C_3F_6$, and $C_4F_8$. These compounds tend to dissociate into branched volatile fragments, such as $CF_2$, $CF_3$, and $C_xF_y (y/x \geq 2)$. In contrast, $C_6F_6$ yields CF, $C_xF_x$, and aromatic ring fragments that result in a highly crosslinked film structure, better able to withstand high temperatures.

The fluorocarbon/adhesion layer stack of the present invention is subjected to rigorous adhesion and thermal testing. Adhesion of the FlAC stack to typical semiconductor substrates and to a silicon oxide overlayer is measured by a stud pull test. In certain embodiments of the present invention, the adhesion of the FlAC stack to a bare silicon or silicon oxide substrate is between 4 and 7 kpsi. The adhesion of a silicon oxide overlayer to the FlAC stack, is between 2 and 6 kpsi. In certain embodiments, the FlAC stack with a silicon oxide overlayer can withstand heating to 400° C. for at least four hours without blistering of the oxide overlayer. The top SiC adhesion layer contains any reactive species formed by thermal decomposition of the FlAC film. A minimum thickness of the top SiC layer of only 15 nm prevents blistering. Thermal stability is important for compatibility with subsequent processing steps in fabrication of a semiconductor device.

DETAILED DESCRIPTION

Figure 1:
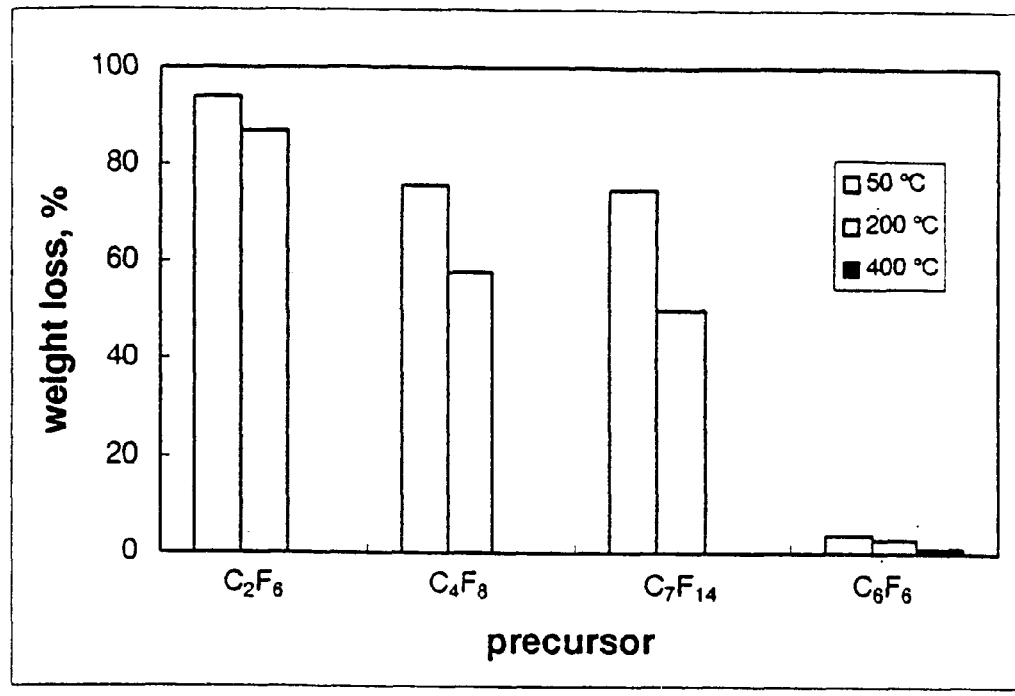
FIG. 1 is a chart displaying weight loss % after 400° C. anneal of FlAC films deposited from different fluorocarbon precursors at different temperatures.

The present invention is directed to a three-layer inter-level dielectric layer stack for use in semiconductor devices. The middle layer is a fluorinated amorphous carbon film which has an advantageously low dielectric constant. To promote adhesion between the FlAC film and typical semiconductor substrates, such as bare silicon or silicon oxide, the bottom layer is a bottom adhesion layer. In a semiconductor device, the bottom adhesion layer is interposed between the FlAC layer and a semiconductor substrate. A top adhesion layer above the FlAC-film forms the third layer. The top adhesion layer also serves as a capping layer, enabling the dielectric stack to withstand sustained exposure to temperatures of 400° C. That is, the top adhesion layer suppresses gas discharge out of the film on heating. According to the present invention, a silicon carbide material containing hydrogen is particularly effective as both the bottom and top adhesion layer. SiC has a dielectric constant between 4.5 and 7.5. However, only a thin layer is needed to serve as an adhesion layer. For example, the bottom SiC adhesion layer is, typically less than 20 nm thick. Approximating the three-layer stack as three capacitors coupled in series, it is readily understood that the thin SiC layer has minimal effect on the dielectric constant of the overall FlAC stack. A minimum thickness of 15 nm is sufficient for the top SiC layer.

The present invention further includes a single continuous process for depositing the SiC/FlAC/SiC stack on a semiconductor wafer by plasma deposition. A high density plasma reactor is used for the deposition. For example, a reactor such as the SPEED™ model reactor platform marketed by Novellus Systems, Inc. of San Jose, Calif., is used. The reactor includes a reaction chamber with an electrostatic chuck for supporting the semiconductor wafer and for providing cooling to the wafer. In the SPEED™ platform, a plasma is produced in the reaction chamber by an external induction coil driven by a radio frequency power source at power levels between 1000 and 3000 Watts (W). It will be recognized by those skilled in the art that alternative ion sources can be used in place of an rf driven induction coil. For example, an electron cyclotron resonance source, microwave tuned cavity, or helicon wave plasma source can be used to generate a high density plasma.

A radio frequency bias of up to 3500 W (for a 200 mm wafer) is optionally applied to the wafer. Deposition is performed at temperatures between 50 and over 400° C. Advantageously, deposition is performed at high temperature, in the neighborhood of 400° C. The deposition pressure is between about 1 and 100 mTorr.

The three layer film stack is deposited in a single continuous process by introducing different process gases at different times, controlling the process conditions for each step of the deposition process. Silane ($SiH_4$) is used in combination with a hydrocarbon gas, e.g. $CH_4$, $C_2H_6$, or $C_2H_2$, as the precursor for the SiC layer. When acetylene ($C_2H_2$) is used as the hydrocarbon in the SiC precursor gas combination, the gases are used in $SiH_4$:$C_2H_2$ flow rate ratios of between 1:1 and 1:5. Advantageously, the $SiH_4$:$C_2H_2$ flow rate ratio is 1:1, resulting in a silicon carbide layer containing hydrogen in which the ratio of atomic Si to atomic C is approximately 1:1 or slightly richer in Si. For other hydrocarbon precursors, the optimal ratio of flow rates to give a SiC film with approximately equal Si and C content is determined empirically.

One or more fluorocarbon gases such as $C_2F_6$, $C_3F_6$, $C_3F_8$, $C_4F_8$, $C_7F_{14}$, or $C_6F_6$ are used as precursors for the deposition of the fluorinated amorphous carbon layer. Use of fluorocarbon precursors with different F:C ratios provides FlAC films with different fluorine content. Hexafluorobenzene($C_6F_6$), with a F:C ratio of 1:1, the lowest of any previously reported fluorocarbon precursor, is advantageously used. $H_2$ is also optionally added to the fluorocarbon gases in the FlAC deposition. The addition of $H_2$ serves to lower the fluorine content of the film due to the reaction of hydrogen with fluorine to produce HF. In addition, a flow of Ar is optionally included as a diluent with the FlAC precursor gases.

Using $C_6F_6$ as a FlAC precursor, either by itself or in combination with another fluorocarbon or hydrogen, films can be deposited at high temperature, approximately at 400° C. In contrast, precursors $C_2F_6$, $C_3F_8$, $C_4F_8$, and $C_7F_{14}$ do not yield FlAC films at a deposition temperature of 400° C. The two primary factors affecting film thermal performance are atomic fluorine content and deposition temperature. As shown in detail in Example 2, below, high temperature deposition with $C_6F_6$ as a fluorocarbon precursor leads to FlAC films with advantageous thermal performance, as evidenced by very small weight loss and thickness change after annealing. Unlike the other listed precursors, which tend to dissociate to volatile fragments, dissociation of $C_6F_6$ yields mainly unbranched CF compounds and aromatic ring fragments. These compounds result in a highly crosslinked film structure, better able to withstand high temperatures.

In the FlAC stack deposition process, first the SiC layer is deposited by providing a flow of $SiH_4$ and a hydrocarbon gas, for example, $C_2H_2$, into the reaction chamber. Next the FlAC precursor gas(es) are provided to deposit the FlAC layer. Finally, a second flow of $SiH_4$ and the hydrocarbon gas is provided to deposit the top SiC adhesion layer. For deposition of the SiC layers, typical flow rates are 30–60 sccm $SiH_4$ and 30–90 sccm $C_2H_2$. Typical flow rates of the FlAC process gases are 20–100 sccm. The flow of the SiC precursors and the flow of FlAC precursor(s), overlap for a certain time period at the start of the deposition of the second and of the third layer. For example, for deposition of the top SiC layer, an overlap of 3 seconds is used. Optionally, the $C_2H_2$ flow starts 1 second before the $SiH_4$ flow. The overlap is necessary for good adhesion of the top adhesion layer.

As described above, the top SiC layer is a thin layer. Alternatively, the top SiC layer can be made thicker, for example, a 600 nm layer. In certain uses in a semiconductor device, the FlAC layer is patterned in an oxygen plasma. A non-etching, inorganic hard mask layer is typically deposited over the dielectric material, i.e. the FlAC stack, to protect certain areas from plasma exposure. A thicker top SiC layer can serve as a hard mask material enabling the FlAC stack and hard mask overlayer to be deposited in a single continuous process.

The SiC/FlAC/SiC dielectric layer deposited as described above is subjected to rigorous thermal and adhesion testing to determine suitability for integration into typical semiconductor fabrication processes. A 500 nm thick silicon oxide overlayer is deposited over the top SiC layer. The FlAC stack with the oxide overlayer is thermally tested by annealing for 4 hours at 400° C. Adhesion is evaluated by a stud pull test before and after the 4-hour anneal. The criterion for thermal stability is absence of blisters in the oxide layer due to decomposition of the underlying fluorinated amorphous carbon layer.

Adhesion and thermal testing was used to evaluate the necessity of an anneal step between deposition of the FlAC stack and the oxide overlayer. Anneal time periods between 0 minutes (no anneal) and 60 minutes at 400° C. were tested. As a result of these tests, it was found that a post-deposition anneal step is not necessary for the thermal stability of the FlAC stack and oxide overlayer. If such a step were necessary, it would have a detrimental effect on throughput of an overall semiconductor fabrication process.

Stud pull measurements were performed with a Sebastion Model 5 apparatus. Aluminum studs precoated with epoxy adhesive were fixed to the surface of a 1 cm square sample. The force required to pull the stud from the sample divided by the adherent area of the stud gives the adhesive strength in kpsi.

The films of the present invention were further characterized as follows: The dielectric constant was derived from C-V measurements taken at 1 MHz on aluminum .dot-insulator-silicon capacitors using a Keithley model 590 instrument. Film composition was determined using Rutherford Back Scattering (RBS). Film hardness (Gpa) was measured by nano indentation using a Nano Indenter®. Wafers were weighed on a Mettler balance before and after heat treatments to determine weight loss.

The advantages of embodiments of the present invention will be further described and understood by reference to the following working examples in which results of rigorous thermal and adhesion testing are presented. These examples are provided to illustrate the present invention and do not provide limits or restrictions thereto.

EXAMPLE 1

Film stacks consisting of a bottom adhesion layer, a fluorinated amorphous carbon layer and a top adhesion layer were deposited on bare silicon wafers in a high density plasma reactor with a hemispherical inductively coupled ion source. The deposition conditions were: plasma induction coil at 3000 W, no rf bias applied to the wafer, deposition temperature approximately 400° C., 100 sccm Ar added to listed FlAC process gases. The top and bottom SiC adhesion layers were deposited with $SiH_4$ and $C_2H_2$ at equal flow rates of 45 sccm. A 3 second overlap between SiC process gases and FlAC process gases was used. The thickness of the adhesion layers was approximately 20 nm. Atomic composition of the adhesion layers was 35% Si, 25% C, and 40% H, as determined by Rutherford Back Scattering with an error limit of ±5%. A 500 nm thick layer of $SiO_2$ was deposited over the top SiC adhesion layer. The FlAC stack with $SiO_2$ overlayer was annealed at 400° C. for 4 hours. Results for different FlAC process gas combinations are given in Table 1 below.

TABLE 1

SiC/FlAC/SiC Film Stack Properties

| FlAC Precursor | $C_6F_6/C_2F_6$ | $C_6F_6/C_2F_6$ | $C_6F_6$ | $C_6F_6/H_2$ | $C_6F_6/H_2$ |
|---|---|---|---|---|---|
| Flow rates (sccm) | 15/15 | 22.5/7.5 | 30 | 30/10 | 30/20 |
| Deposition pressure (mTorr) | 2.9 | 3.0 | 2.7 | 3.0 | 3.2 |
| F content (atomic %) | 45 | 43 | 40 | 37 | 31 |
| Film F:C ratio | 0.81 | 0.78 | 0.71 | 0.63 | 0.51 |
| Film Thickness (nm) | 400 | 490 | 480 | 530 | 560 |
| Deposition rate (nm/min) | 150 | 300 | 380 | 350 | 310 |
| Dielectric constant | 2.53 | 2.61 | 2.85 | 3.01 | 3.34 |
| Film Hardness (GPa) | 0.26 | 0.34 | 1.23 | 1.04 | 1.20 |
| Adhesion (oxide on FlAC stack) (no anneal) (kpsi) | 1.4 | 0.5 | 6.1 | 7.4 | 1.8 |
| Adhesion (oxide on FlAC stack) (4 hr anneal) (kpsi) | 1.6 | 0.7 | 4.9 | 5.5 | 2.4 |

As demonstrated above, no film showed degradation of adhesion due to the 4 hour anneal, within measurement uncertainty. The adhesion of the FlAC stack to the bare silicon wafer was between 4 and 7 kpsi.

EXAMPLE 2

Figure 2:
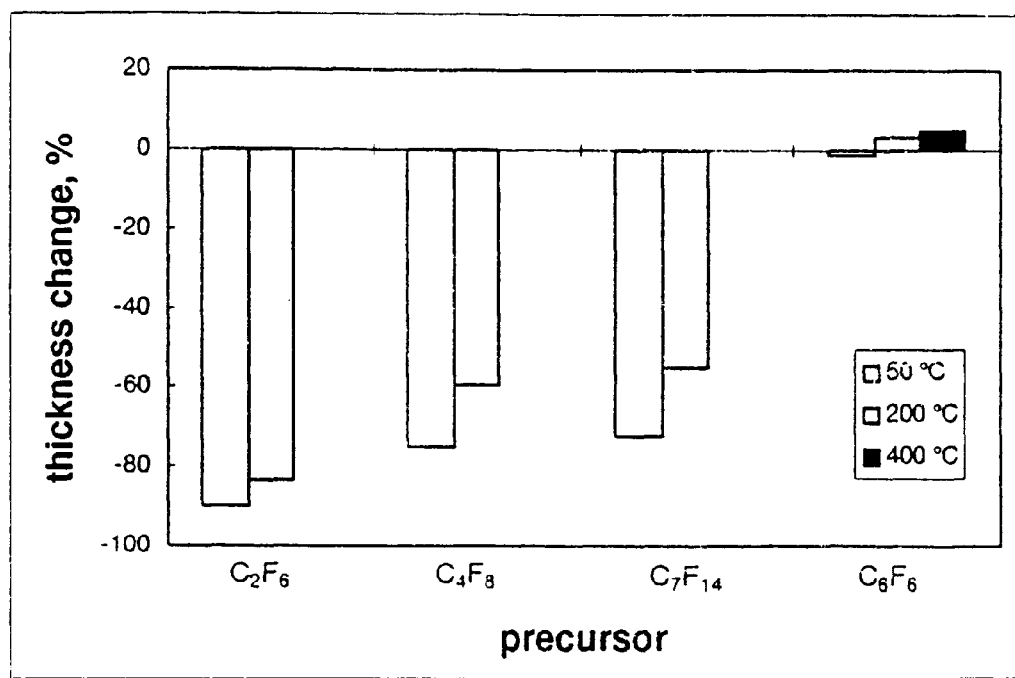
FIG. 2 is a chart displaying thickness change % after 400° C. anneal of FlAC films deposited from different fluorocarbon precursors at different temperatures.

A FlAC layer was deposited over a 20 nm SiC adhesion layer on a bare silicon wafer in the high density plasma reactor as described in Example 1 above: plasma induction coil at 3000 W, no rf bias applied to the wafer, and 100 sccm Ar diluent added. Three approximate deposition temperatures were used: 50° C., 200° C., and 400° C. Fluorocarbon precursors and other conditions are listed in Table 2 below. $C_6F_6$ was the only precursor which yielded a film at a deposition temperature of 400° C. The FlAC films were annealed for one hour at 400° C. Weight loss and thickness change following anneal for films from different precursors are illustrated in FIGS. 1 and 2. A one hour anneal of a film deposited from $C_2F_6$ at 50° C. resulted in almost complete decomposition (95% weight loss). Conversely, a film deposited from $C_6F_6$ at 50° C. showed only a 3.5% loss following anneal. Weight loss was <1% per hour on $C_6F_6$ films deposited at 400° C.

TABLE 2

Deposition Conditions for Thermal Performance Testing

| FlAC Precursor | $C_2F_6$ | $C_4F_8$ | $C_7F_{14}$ | $C_6F_6$ |
|---|---|---|---|---|
| Flow rate (sccm) | 90 | 45 | 26 | 30 |
| Deposition pressure (mTorr) | 4.9 | 3.9 | 3.7 | 2.7 |
| F content (atomic %) | 58 | 50 | 51 | 40 |

In view of the foregoing, it will be understood that embodiments of the present invention have been enabled that advantageously provide SiC/FlAC/SiC film stacks for use as interlevel dielectric layers in semiconductor devices. The enhanced thermal performance of fluorinated amorphous carbon films deposited from $C_6F_6$ as a fluorocarbon precursor has been shown. Adhesion of an oxide overlayer to SiC/FlAC/SiC film stacks and resistance of the film stacks to heating at 400° C. for four hours has been demonstrated. In addition, it will be realized that methods for making the aforementioned film stacks have also been provided herein.

We claim:

1. A process of producing an interlevel dielectric stack on a semiconductor substrate, comprising:

introducing a semiconductor substrate in a high density plasma reactor;

providing a flow of $SiH_4$ and a hydrocarbon gas in the reactor;

providing a flow of one or more fluorinated amorphous carbon films precursor gases in the reactor; and providing a flow of $SiH_4$ and a hydrocarbon gas in the reactor.

2. The process of claim 1 wherein the fluorinated amorphous carbon film precursor gases are selected from the group consisting of $C_2F_6$, $C_3F_6$, $C_3F_8$, $C_4F_8$, $C_7F_{14}$, $C_6F_6$, and $H_2$.

3. The process of claim 1 wherein the fluorinated amorphous carbon film precursor gases include $C_6F_6$.

4. The process of claim 1 wherein providing a flow of $SiH_4$ and a hydrocarbon gas overlaps providing a flow of fluorinated amorphous carbon film precursor gases.

5. The process of claim 1 wherein the hydrocarbon gas is $C_2H_2$.

6. The process of claim 5 wherein the $SiH_4$ and $C_2H_2$ flow rates are approximately equal.

7. A process of producing an interlevel dielectric stack on a semiconductor substrate, comprising:

introducing a semiconductor substrate in a high density plasma reactor;

providing a flow of $SiH_4$ and $C_2H_2$ in the reactor at approximately equal flow rates to deposit a bottom adhesion layer;

next, providing a flow of fluorinated amorphous carbon film precursor in the reactor, such precursor flow comprising $C_6F_6$ and such flow overlapping the flow of $SiH_4$ and $C_2H_2$ for a time period, such time period being a small fraction of the total time for flow of fluorinated amorphous carbon film precursor; and finally, providing a flow of $SiH_4$ and $C_2H_2$ at equal flow rates in the reactor to deposit a top adhesion layer, such flow overlapping the flow of fluorinated amorphous carbon film precursor for a time period equal to said time period.

* * * * *